United States Patent
Jang

(10) Patent No.: US 6,221,714 B1
(45) Date of Patent: Apr. 24, 2001

(54) METHOD OF FORMING A CONTACT HOLE IN A SEMICONDUCTOR SUBSTRATE USING OXIDE SPACERS ON THE SIDEWALLS OF THE CONTACT HOLE

(75) Inventor: Soon-Kyou Jang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/335,784

(22) Filed: Jun. 18, 1999

(30) Foreign Application Priority Data

Jun. 29, 1998 (KR) .................................... 98-25172

(51) Int. Cl.[7] ...................... H01L 21/311; H01L 21/335
(52) U.S. Cl. ...................... 438/241; 438/624; 438/639
(58) Field of Search ................................. 438/241, 624, 438/639, FOR 355, 970

(56) References Cited

U.S. PATENT DOCUMENTS 5,786,249 * 7/1998 Denninson .
5,933,755 * 8/1999 Lee .
6,004,843 * 12/1999 Huang .
6,083,828 * 7/2000 Lin et al. .
6,096,601 * 8/2000 Itoh .

\* cited by examiner

*Primary Examiner*—George Fourson
*Assistant Examiner*—Joannie A. Garcia
(74) *Attorney, Agent, or Firm*—Jones Volentine, L.L.C.

(57) ABSTRACT

A method of forming a contact hole in a semiconductor device is provided wherein an oxide spacer is formed over a contact hole. The oxide contact hole spacer prevents an already-formed gate protecting spacer comprised of silicon nitride from being etched during a subsequent step of removing the already-formed silicon nitride etching stopper. After forming a gate stack having the protecting spacer, the silicon nitride etching stopper is formed. An interlayer insulating layer is formed thereon and a selected portion of the interlayer insulating layer is etched to form a contact hole. The oxide spacer is formed on both sidewalls of the contact hole and then the etching stopper silicon nitride layer is removed.

7 Claims, 8 Drawing Sheets

METHOD OF FORMING A CONTACT HOLE IN A SEMICONDUCTOR SUBSTRATE USING OXIDE SPACERS ON THE SIDEWALLS OF THE CONTACT HOLE

This application relies for priority upon Korean Patent Application No. 98-25172, filed on Jun. 29, 1998, the contents of which are herein incorporated by reference in their entirety.

FIELD OF THE INVENTION

The present invention relates to a contact hole fabrication, and more particularly to a method of forming a contact hole using oxide spacers on sidewalls of a contact hole to protect gate protecting spacers.

BACKGROUND OF THE INVENTION

One important technique for fabricating a semiconductor device involves forming a connection between an upper level wiring layer and either a conductive region of an impurity-diffused layer in a semiconductor substrate or a lower level wiring layer. Such a connection is preferably formed through a contact hole formed in an interlayer insulating film.

Recently as the density of integrated circuits has increased, the design rule, i.e., the minimum feature size, has decreased. As a result, the distance between gate stacks in a semiconductor device is being shortened to coordinate this reduced design rule. Accordingly, a contact hole opened in the interlayer insulating layer between the gate stacks has a high aspect ratio and an over-etch is implemented during a step of etching the interlayer insulating layer. However, such an over-etch may also etch a silicon nitride gate spacer that operates to protect the gate stacks.

FIGS. 1A to 1D are cross-sectional views at selected stages of a conventional fabrication process for forming a contact hole between gate stacks. FIG. 1A schematically shows a semiconductor substrate 10 having a cell array region and a core region, each area having a plurality of gate stacks 18. Each gate stack 18 includes a gate oxide layer 11, a gate electrode 15, and a silicon nitride capping layer 16. The gate electrode 15 is generally made of a multilayer structure of a polysilicon layer 12 and a tungsten silicide layer 14. A first silicon nitride layer 20 is generally deposited over the entire surface of the semiconductor substrate 10 and the plurality of gate stacks 18 by a conventional method such as chemical vapor deposition (CVD).

The first silicon nitride layer 20 is then etched back to form spacers 21 on both sidewalls of the gate stacks 18 as shown in FIG. 1B. A second silicon nitride layer 22 is then deposited over the resulting structure, including the substrate 10 and the gate stacks 18, to serve as an etching stopper. An interlayer insulating layer 24 is then deposited over the gate stacks 18 and in the spaces between the gate stacks 18.

Referring to FIG. 1C, selected portions of the interlayer insulating layer 24 are etched to form a plurality of contact holes 26 between the gate stacks 18 using the second silicon nitride layer 22 as an etching stopper.

After forming the contact holes 26, the second silicon nitride layer 22 between the gate stacks is removed as shown in FIG. 1D.

The above-mentioned method uses silicon nitride for the capping layer 16, the gate spacer 21, and the etching stopper 22. As a result, the gate spacer 21 and the capping layer 16 are also etched during the step of etching the second silicon nitride layer 22, as shown in inside the dotted circle of FIG. 1D. Accordingly, the gate electrode 15 may electrically contact the subsequently-formed conductive bit line and storage node pads (or landing pads).

SUMMARY OF THE INVENTION

The present invention was made in view of the above problem, and it is therefore an object of the invention to provide a method of forming a contact hole between the gate stacks without etching the gate spacer and gate capping layer. A key feature of this invention is to form a protective spacer layer having an etching selectivity with respect to the silicon nitride layer after forming the contact hole. The protective layer is preferably formed on the sidewalls of the contact hole with a silicon oxide layer. The protective silicon oxide layer acts to protect an underlying silicon nitride layer. The silicon oxide layer forms a gate stack spacer together with the underlying silicon nitride layer on sidewalls of the gate stacks. The present invention provides double gate spacers comprised of two different layers having an etching selectivity with respect to each other.

In accordance with these and other objects, a method of forming a contact hole in a semiconductor device is provided, including forming at least two gate stacks over a semiconductor substrate, forming a first insulating layer over the semiconductor substrate and at least two gate stacks, forming an interlayer insulating layer over the first insulating layer, etching a selected portion of the interlayer insulating layer to form a contact hole between the gate stacks, forming a second insulating layer over the interlayer insulating layer, the contact hole and the semiconductor substrate, etching back the second insulating layer to form spacers on sidewalls of the contact hole, and using the interlayer insulating layer and the spacers as a mask to etch the first insulating layer to expose a top surface of the semiconductor substrate.

In this method, the first insulating layer preferably comprises silicon nitride and has a thickness of about 50 Å to 100 Å. The first insulating layer preferably serves as an etching stopper during the etching of the interlayer insulating layer. The second insulating layer comprises silicon oxide and has a thickness of about 300 Å to 500 Å.

Each of the gate stacks preferably comprises a gate oxide layer, a gate electrode, and a gate capping insulating layer. The gate capping insulating layer preferably comprises silicon nitride.

A method of forming a contact hole in a semiconductor substrate is also provided in which the semiconductor substrate has a cell array region and a core region, the cell array region having at least two first gate stacks and the core region having at least two second gate stacks. This method includes forming first and second insulating layers over the semiconductor substrate, the first gate stacks, and the second gate stacks, forming a first photoresist layer over the second insulating layer to cover the cell array region and to expose the core region, using the first photoresist layer as a mask to etch the first and second insulating layers to form first spacers on sidewalls of the second gate stacks, removing the first photoresist layer, forming a second photoresist layer to cover the core region and to expose the cell array region, using the second photoresist layer as a mask to etch the second insulating layer to expose the first insulating layer, removing the second photoresist layer, forming an interlayer insulating layer over the semiconductor substrate, the first gate stacks, and the second gate stacks, etching a selected portion of the interlayer insulating layer to form a contact hole between the first gate stacks, forming a third insulating layer over the semiconductor substrate, the first gate stacks, the second gate stacks, and the contact hole, etching the third insulating layer to form second spacers on sidewalls of the contact hole, and using the interlayer insulating layer and the second spacers as a mask to etch the first insulating layer to expose a top surface of the semiconductor substrate.

In this method, the first insulating layer preferably comprises silicon nitride and has a thickness of about 50 Å to 100 521. The first insulating layer preferably serves as an etching stopper during the etching of the interlayer insulating layer. The second insulating layer preferably comprises silicon oxide and has a thickness of about 500 Å. The third insulating layer preferably comprises silicon oxide and has a thickness of about 300 Å to 500 Å.

Each of the gate stacks preferably comprises a gate oxide layer, a gate electrode, and a gate capping insulating layer. The gate capping insulating layer preferably comprises silicon nitride.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1A:
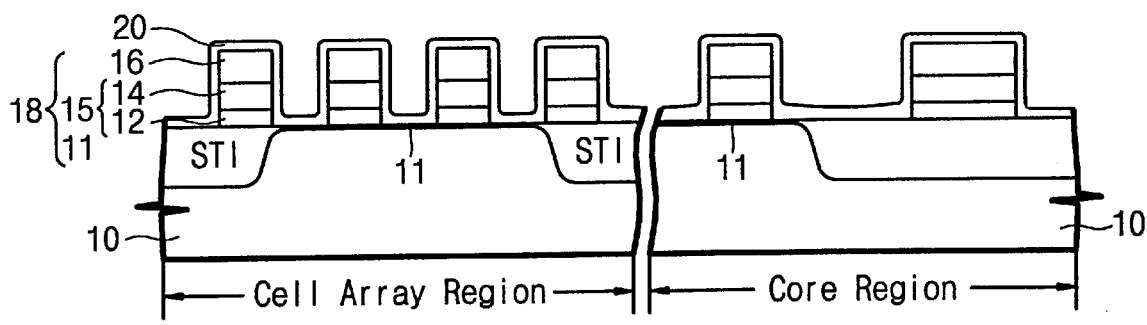
FIGS. 1A to 1D are cross-sectional views at selected stages of a conventional fabrication process for forming a contact hole between gate stacks.
Figure 1B:
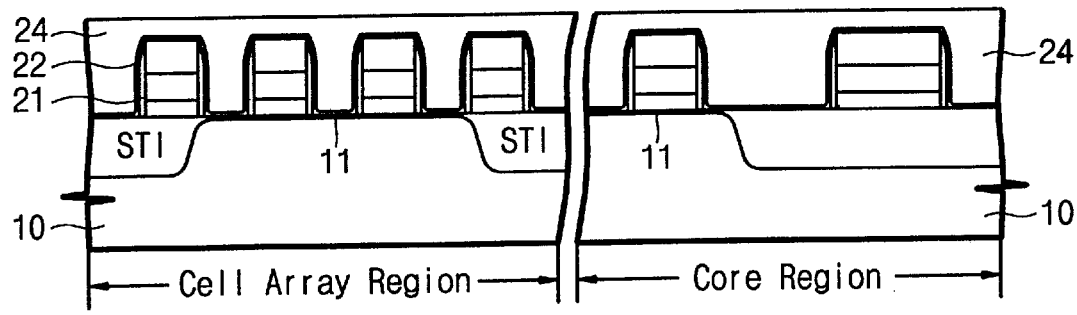
Figure 1C:
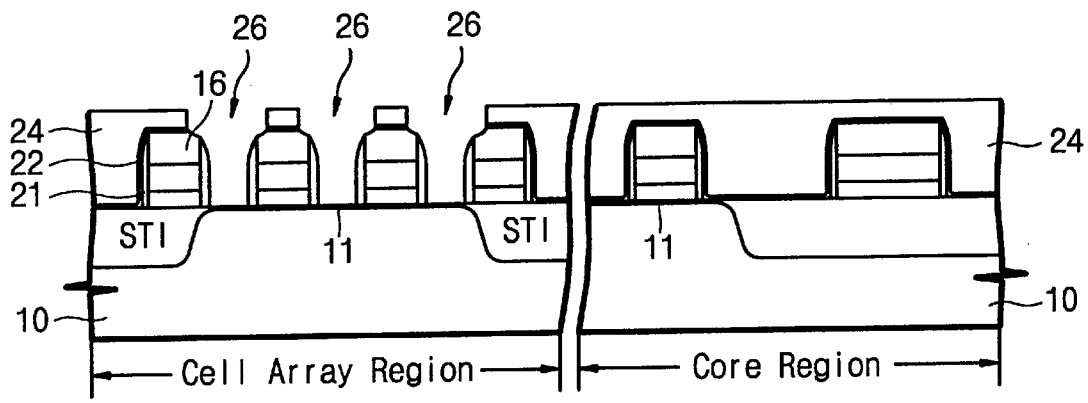
Figure 1D:
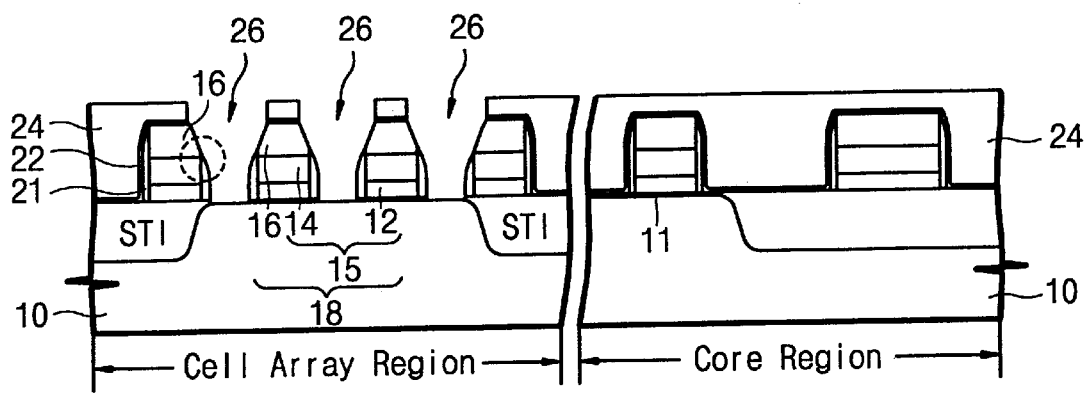
Figure 2:
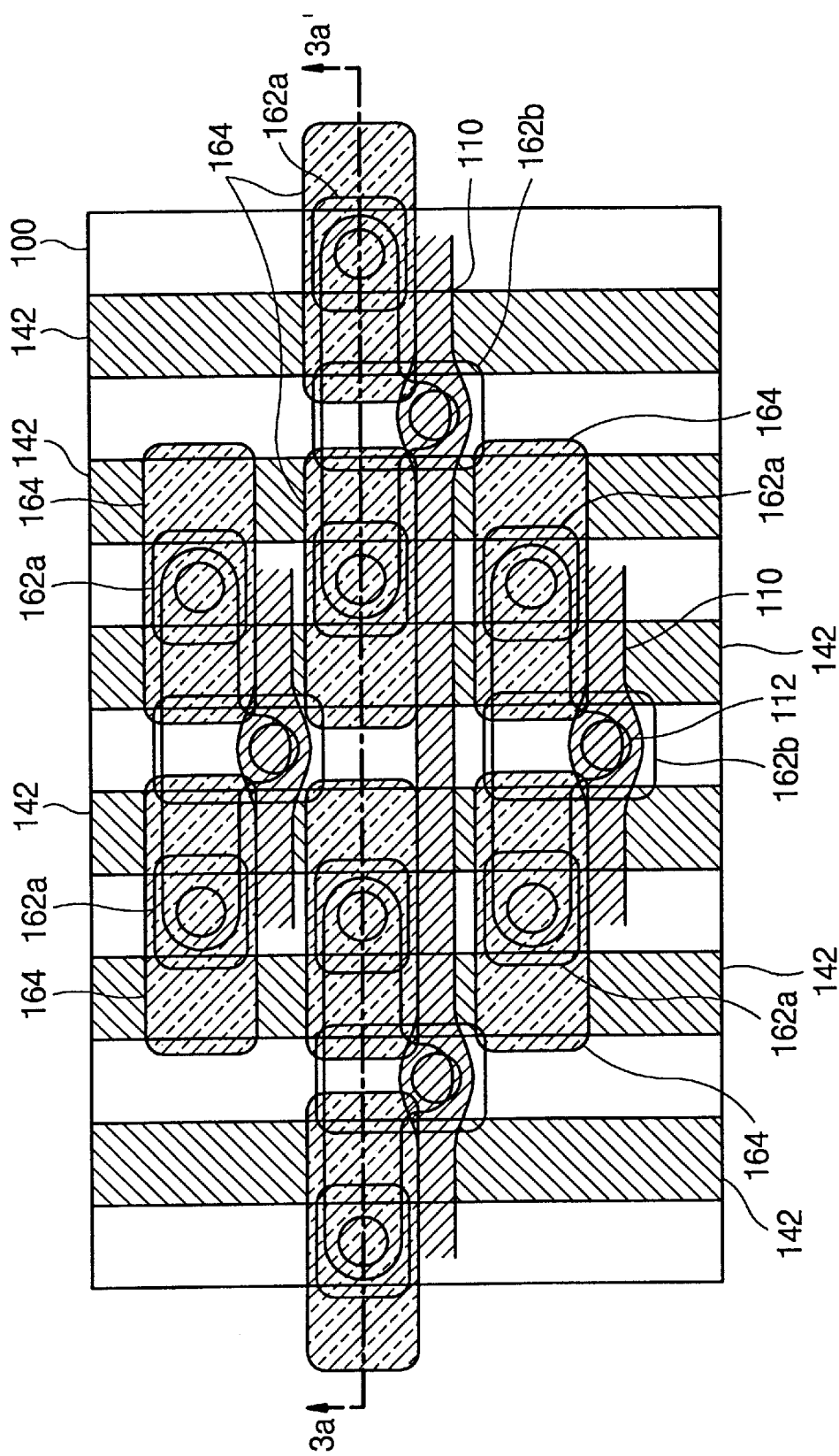
FIG. 2 is a layout diagram of a DRAM in accordance with a preferred embodiment of the present invention.

FIG. 2 schematically shows a layout diagram of a DRAM device in accordance with a preferred embodiment of the present invention. As shown in FIG. 2, a plurality of gate electrodes 142 are running straight and spaced apart from each other by a predetermined distance over a semiconductor substrate 100. A plurality of bit line contact pads 162b and storage node contact pads 162a are disposed over selected portion of the spaces between the gate electrodes 142. A plurality of storage nodes 164 are aligned over corresponding storage node contact pads 162a and are electrically connected to the contact pads 162a through storage contacts (not shown) formed in an interlayer insulating layer (not shown). A plurality of bit lines 110 intersect the gate electrodes 142 and are connected to the bit line contact pads 162b through bit line contacts 112 in the interlayer insulating layer (not shown).

A preferred embodiment of the present invention will now be described with reference to the accompanying drawings. The present invention relates to a method of forming a contact hole between transistors, and more particularly to a contact hole formation process that can prevent transistor components (e.g., a silicon nitride capping layer and a silicon nitride spacer) from being etched during the step of etching the etching stopper silicon nitride layer.

FIGS. 3A to 3I are cross-sectional views at selected stages of the preferred embodiment of the fabrication process for forming a contact hole between gate stacks, taken along line 3a–3a' of FIG. 2.

Figure 3A:
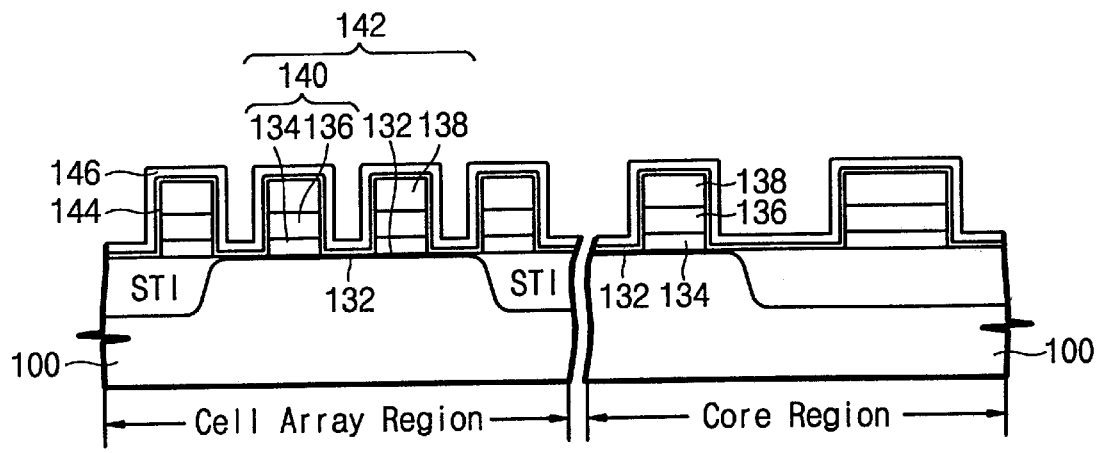
FIGS. 3A to 3I are cross-sectional views at selected stages of a fabrication process for forming a contact hole between gate stacks, taken along line 3a–3a' of FIG. 2.

As shown in to FIG. 3A, a semiconductor topography is provided that has already undergone several processes according to the preferred embodiment of the present invention. A semiconductor substrate 100 is initially provided in which a cell array region and a core region are defined. A device isolation layer is formed in and over the semiconductor substrate 100 to isolate active areas. A plurality of gate electrode patterns 142 (i.e., gate stacks) are conventionally formed over both the cell array and core regions. Each gate stack 142 preferably includes a gate oxide layer 132, a gate electrode 140, and a silicon nitride capping layer 138.

In a preferred embodiment of this invention, the gate electrode 140 comprises a multilayer structure including a polysilicon layer 134 that is about 700 Å thick and a tungsten silicide layer 136 that is about 1,000 Å thick. A first insulating layer 144 and a second insulating layer 146 are then sequentially formed over the entire surface of the semiconductor substrate 100 and the gate stacks 142. The first insulating layer 144 is preferably made of silicon nitride and preferably has a thickness in the range of about 50 Å to 100 Å. The second insulating layer 146 is preferably made of silicon oxide and preferably has a thickness of about 500 Å.

Figure 3B:
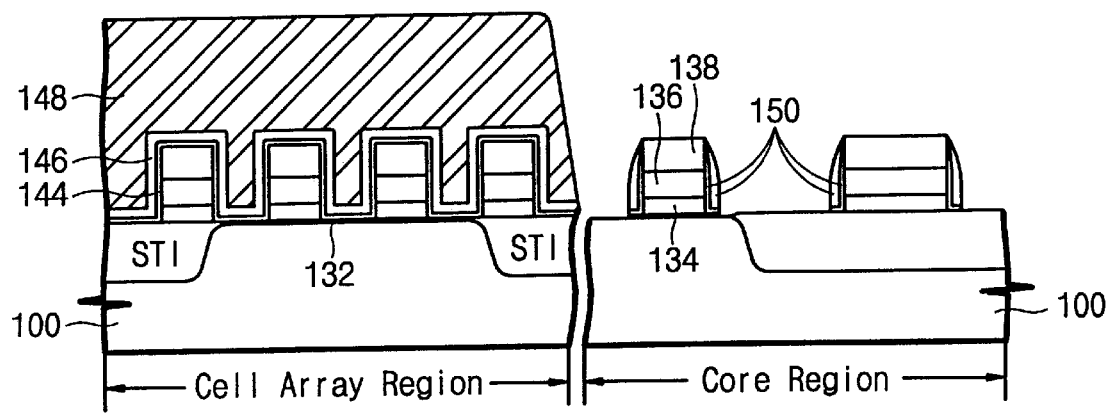

Referring to FIG. 3B, a first photoresist layer is deposited over the second insulating layer 146 and is patterned into a desired configuration as a first patterned photoresist layer 148 that exposes only the core region. The second insulating layer 146 and first insulating layer 144 exposed by the first patterned photoresist layer 148 are etched back to form spacers 150 on both sidewalls of the gate stacks 142 in the core region.

Figure 3C:
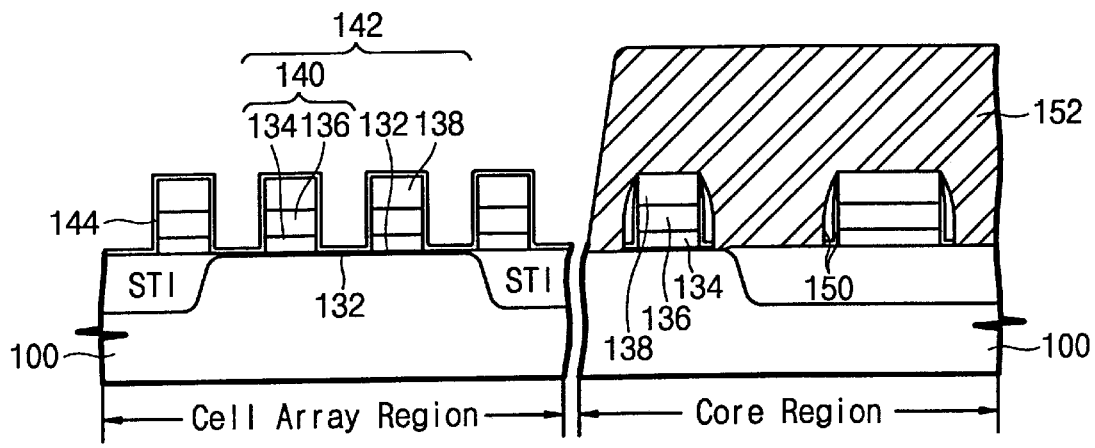

After removing the first patterned photoresist layer 148 by a conventional method such as plasma ashing, a second patterned photoresist layer 152 is formed to expose only the cell array region, as shown in FIG. 3C. Using the second patterned photoresist layer 152 to shield the core region, the silicon oxide layer 146 in the cell array region is etched to expose the silicon nitride layer 144. The etching of the oxide layer 146 is preferably carried out by conventional wet etching process. The second patterned photoresist layer 152 is then preferably removed by plasma ashing.

Figure 3D:
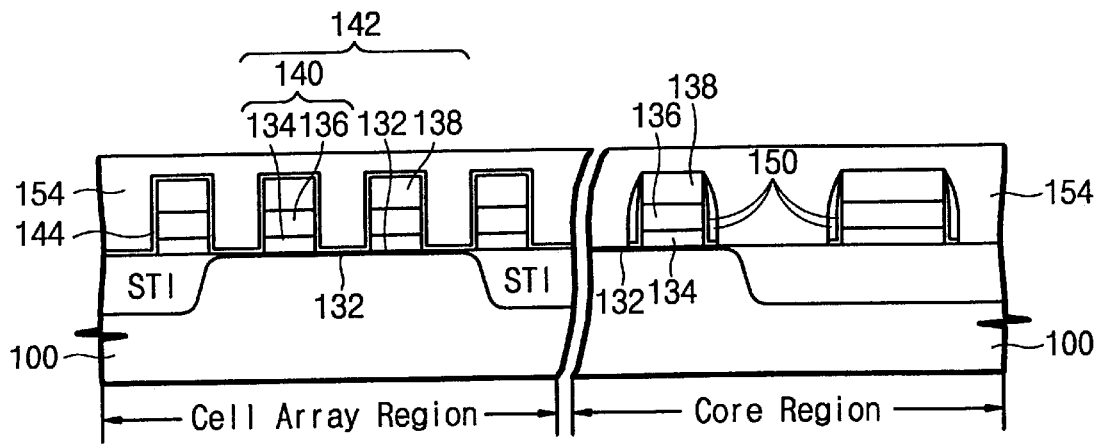

Referring to FIG. 3D, a planar interlayer insulating layer 154 is then formed over the resulting structure, preferably by the process of depositing and planarizing. The planarizing process step itself preferably includes a chemical mechanical polishing (CMP) step. A third photoresist layer (not shown) is then deposited over the interlayer insulating layer 154 and is patterned into a desired configuration that exposes a desired portion of the cell array region.

Figure 3E:
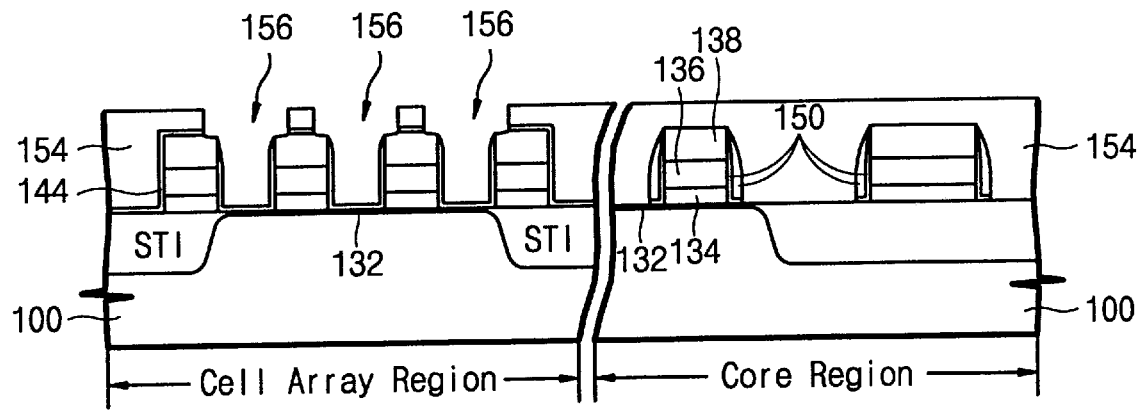

Using the third patterned photoresist layer, the interlayer insulating layer 154 is etched down to the silicon nitride layer 144 in certain areas, to form a plurality of contact holes 156 between the gate stacks as shown in FIG. 3E. During this process, the silicon nitride layer 144 preferably serves as etching stopper.

Figure 3F:
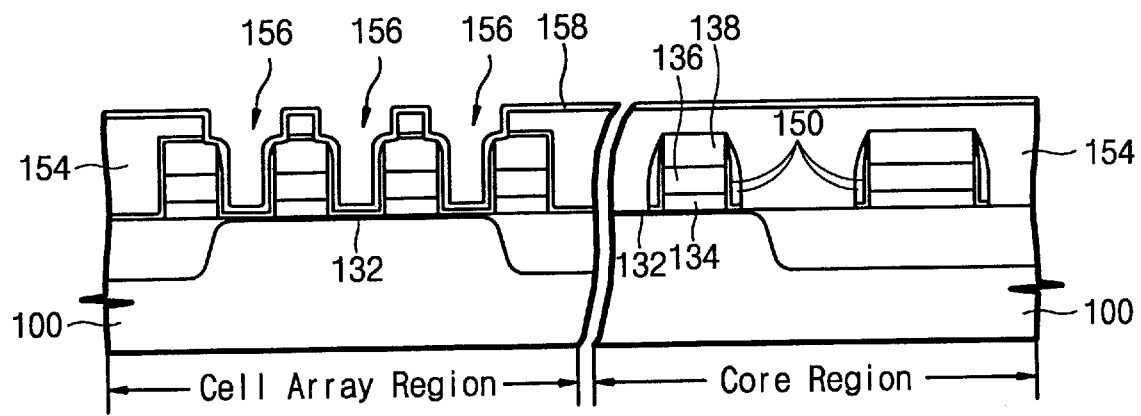

Referring to FIG. 3F, a third insulating layer 158 is deposited over the resulting structure shown in FIG. 3E. The third insulating layer 158 is preferably made of silicon oxide and preferably has a thickness in the range of about 300 Å to 500 Å. This silicon oxide layer 158 protects the silicon nitride capping layer 138 and a first insulating layer, i.e., silicon nitride layer 144.

Figure 3G:
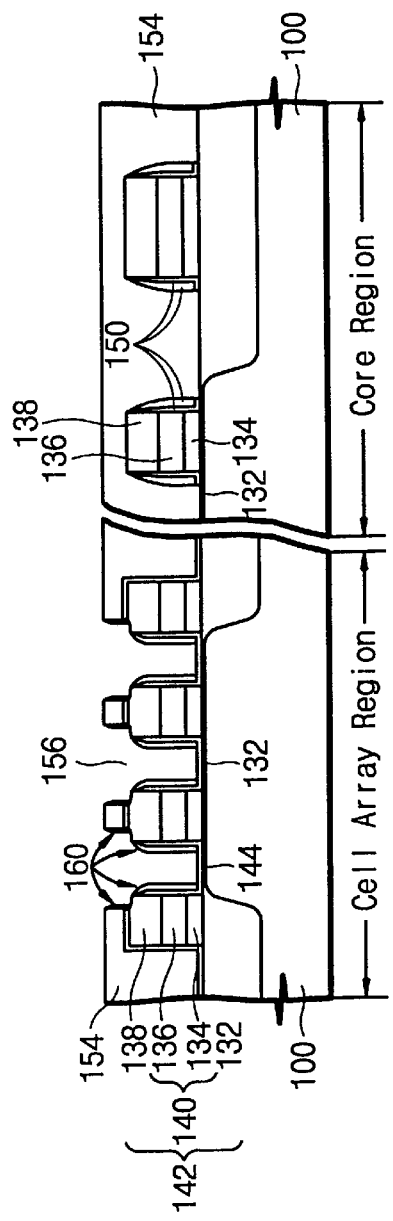

The third silicon oxide layer 158 is then etched to form oxide spacers 160 on the first silicon nitride layer 144 that is formed on sidewalls of the contact holes 156 as shown in FIG. 3G.

Figure 3H:
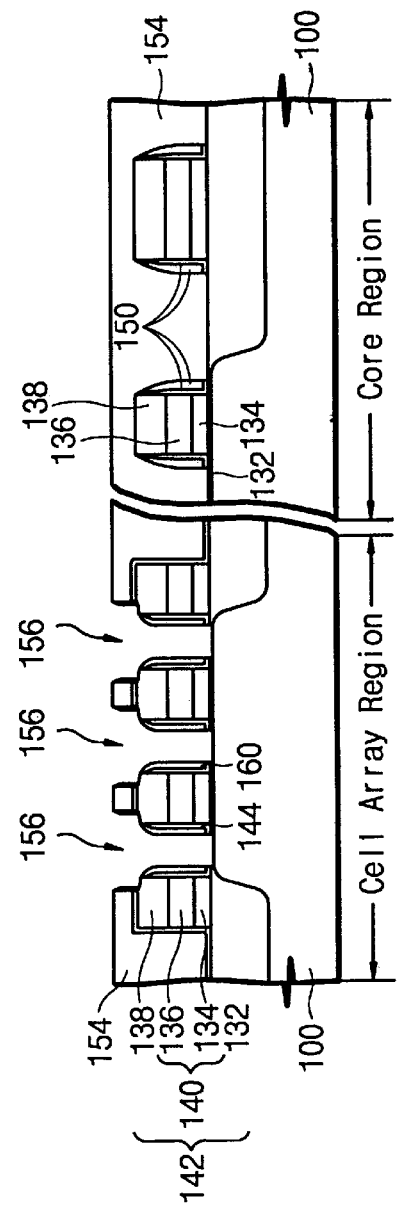

Using the oxide spacers 160 as a mask, the first silicon nitride layer 144 between the gate stacks is then removed as shown in FIG. 3H.

Figure 3I:
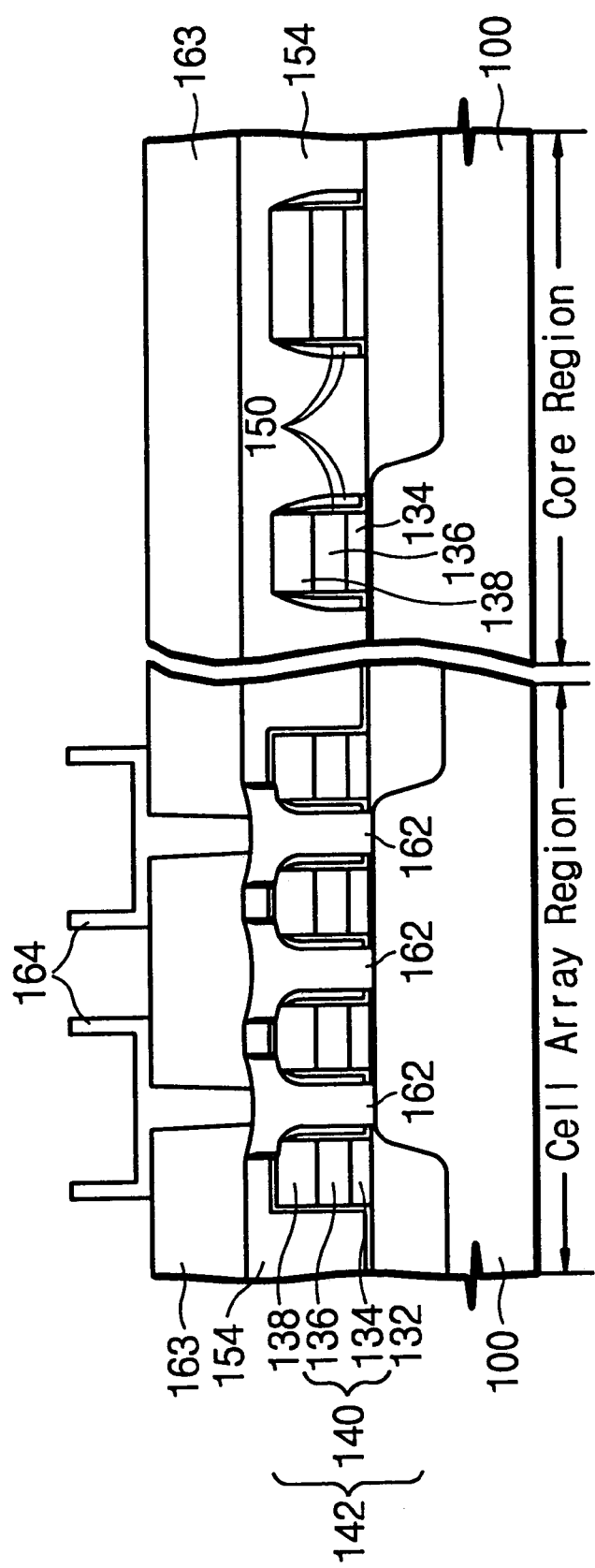

After completely forming the contact hole, contact pads 162 for a bit line (corresponding to bit line contact pads 162*b* from FIG. 2) and contact pads 162 for a storage node (corresponding to storage node contact pads 162*a* from FIG. 2) are conventionally formed, as shown in FIG. 3I. A fourth insulating layer 163 is deposited over the resulting structure. Storage nodes 164 are then formed to electrically be connected to the contact pads 162 for the storage node.

It will be recognized by those skilled in the art that the innovative concepts disclosed in the present application can be applied in a wide variety of contexts. Moreover, the preferred implementations can be modified in a tremendous variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts.

What is claimed is:

1. A method of forming a contact hole in a semiconductor substrate, the semiconductor substrate having a cell array region and a core region, the cell array region having at least two first gate stacks and the core region having at least two second gate stacks, the method comprising:

forming first and second insulating layers over the semiconductor substrate, the first gate stacks, and the second gate stacks;

forming a first photoresist layer over the second insulating layer to cover the cell array region and to expose the core region;

using the first photoresist layer as a mask to etch the first and second insulating layers to form first spacers on sidewalls of the second gate stacks;

removing the first photoresist layer;

forming a second photoresist layer to cover the core region and to expose the cell array region;

using the second photoresist layer as a mask to etch the second insulating layer to expose the first insulating layer;

removing the second photoresist layer;

forming an interlayer insulating layer over the semiconductor substrate, the first gate stacks, and the second gate stacks;

etching a selected portion of the interlayer insulating layer to form a contact hole between the first gate stacks;

forming a third insulating layer over the semiconductor substrate, the first gate stacks, the second gate stacks, and the contact hole;

etching the third insulating layer to form second spacers on sidewalls of the contact hole; and using the interlayer insulating layer and the second spacers as a mask to etch the first insulating layer to expose a top surface of the semiconductor substrate.

2. A method of forming a contact hole in a semiconductor device, as recited in claim 1, wherein the first insulating layer comprises silicon nitride and has a thickness of about 50 Å to 100 Å.

3. A method of forming a contact hole in a semiconductor device, as recited in claim 1, wherein the second insulating layer comprises silicon oxide and has a thickness of about 500 Å.

4. A method of forming a contact hole in a semiconductor device, as recited in claim 1, wherein the third insulating layer comprises silicon oxide and has a thickness of about 300 Å to 500 Å.

5. A method of forming a contact hole in a semiconductor device, as recited in claim 1, wherein the first insulating layer serves as an etching stopper during the etching of the interlayer insulating layer.

6. A method of forming a contact hole in a semiconductor device, as recited in claim 1, wherein each of the first and second gate stacks comprises a gate oxide layer, a gate electrode, and a gate capping insulating layer.

7. A method of forming a contact hole in a semiconductor device, as recited in claim 6, wherein each of the gate capping insulating layers comprises silicon nitride.

\* \* \* \* \*